(12) United States Patent
Huitema et al.

(10) Patent No.: US 8,673,665 B2
(45) Date of Patent: Mar. 18, 2014

(54) PIXEL PERFORMANCE IMPROVEMENT BY USE OF A FIELD SHIELD

(75) Inventors: Hjalmar Edzer Ayco Huitema, Veldhoven (NL); Gerwin Hermanus Gelinck, Valkenswaard (NL)

(73) Assignee: Creator Technology B.V., Breda (NL)

( * ) Notice: Subject to any disclaimer, the term of this patent is extended or adjusted under 35 U.S.C. 154(b) by 467 days.

(21) Appl. No.: 13/167,673

(22) Filed: Jun. 23, 2011

(65) Prior Publication Data

US 2011/0256649 A1 Oct. 20, 2011

Related U.S. Application Data

(62) Division of application No. 11/993,779, filed as application No. PCT/IB2006/052136 on Jun. 27, 2006, now Pat. No. 7,989,806.

(60) Provisional application No. 60/695,665, filed on Jun. 30, 2005.

(51) Int. Cl.
*H01L 33/08* (2010.01)

(52) U.S. Cl.
USPC .............................................. 438/34; 438/22

(58) Field of Classification Search
USPC ...................................................... 438/34, 22
See application file for complete search history.

(56) References Cited

FOREIGN PATENT DOCUMENTS

| JP | 7-311389 | 11/1995 |
|---|---|---|
| JP | 9-90424 | 4/1997 |
| JP | 9-152628 | 6/1997 |
| JP | 9-258264 | 10/1997 |
| JP | 2003-107529 | 4/2003 |
| KR | 10-2004-0053848 | 6/2004 |

OTHER PUBLICATIONS

Korean Intellectual Property Office, Office Action, Patent Application U.S. Appl. No. 10-2008-7002526, Aug. 30. 2012, Korea.

*Primary Examiner* — Long Pham

(57) ABSTRACT

A pixel cell (100) and method for making the same for an active matrix display includes a pixel pad (110) and a thin film field effect transistor (106) which selectably couples a signal to activate/deactivate the pixel pad. A field shield (112) is formed on an insulating layer (102) and connected to the pixel pad through the insulating layer such that the field shield extends over at least a portion of the pixel pad. The field shield may extend over the thin film transistor and form a second gate (215) used to enhance the performance of the thin film transistor and the pixel cell.

19 Claims, 8 Drawing Sheets

US 8,673,665 B2

PIXEL PERFORMANCE IMPROVEMENT BY USE OF A FIELD SHIELD

CROSS REFERENCE TO RELATED APPLICATIONS

This application is a Divisional of application Ser. No. 11/993,779, filed Mar. 20, 2008, which is a national entry of PCT/IB2006/052136, filed Jun. 27, 2006, which claims the priority of U.S. provisional application 60/695,665, filed Jun. 30, 2005, the entirety of which are incorporated herein for reference.

BACKGROUND OF THE INVENTION

1. Field of the Invention

This disclosure relates to pixel cells for active matrix displays and more particularly to thin film transistor devices which employ field shields to improve performance.

2. Description of the Related Art

E-ink capsules react to voltages placed on them and are used for generating images. The capsule includes white and black ink (E-ink), which are reactive and move in accordance with the voltage applied to the capsule or cell. To change image content on an electrophoretic E-ink display, new image information is written for a certain amount of time (e.g., 500 ms-1000 ms). As the refresh rate of an active-matrix is usually higher, this results in addressing the same image content during a number of frames (e.g., at a frame rate of 50 Hz, 25 to 50 frames).

Referring to FIG. 1, a schematic drawing of the E-ink capsule 12 is illustratively shown. Addressing of E-ink from black to white, for example, requires pixel capacitor plates 10a and 10b to be charged to −15 V during a 500 ms to 1000 ms interval. During this time the white particles drift towards the top (common) electrode, while the black particles drift towards the bottom (active-matrix back plane) electrode. Switching to black requires a positive pixel voltage. At 0 V on the pixel capacitor the E-ink does not switch.

Referring to FIG. 2, an equivalent circuit 20 of a pixel 22 in an active-matrix display is shown. A row electrode 24 forms a storage capacitor for the pixels in a next row. Active-matrix displays are driven a row-at-a-time. During one frame time, all the rows are sequentially selected by applying a voltage that changes thin film transistors (TFTs) 26 from a non-conducting state (+25V) to a conducting state (−25V). In this line selection time, the pixel capacitors 28 and 30 (i.e. the total capacitance at the drain side of the TFT) of the selected row are charged to the voltage supplied on a column electrode 32 (+/−15V, 0V). During the remaining frame time (i.e. the hold time), the other rows are addressed. The TFTs 26 are then in their non-conducting state and the charge on the pixel capacitors 28 and 30 must be retained. Between image updates the active-matrix is at rest at 0 V for the row and column electrodes, the pixel pads and the common electrode.

$C_{DE}$ is the capacitor 30 providing the display effect, $C_{st}$ is the storage capacitor 28 and $C_{gd}$ is the parasitic gate-drain capacitor (not shown) in the TFT 26. In the circuit 20, the previous row electrode forms the storage capacitor line.

BRIEF SUMMARY OF THE INVENTION

In accordance with the invention, a pixel cell and method for making the same for an active matrix displays includes a pixel pad and a thin film field effect transistor which selectably couples a signal to activate/deactivate the pixel pad. A field shield is formed on an insulating layer and connected to the pixel pad/transistor through the insulating layer such that the field shield extends over at least a portion of pixel electrodes (e.g., the pixel pad) or the transistor. The field shield may extend over the thin film transistor and form a second gate used to enhance the performance of the thin film transistor and the pixel cell.

A method for forming a pixel for active matrix displays includes forming an insulating layer over a pixel stack, the pixel stack including a thin film transistor, a pixel pad and addressing lines, and patterning a conductive layer formed over the insulating layer to form a field shield which connects to the pixel pad. The field shield connects to the pixel pad through the insulating layer such that the field shield extends over at least a portion of the thin film transistor to form a second gate, which enhances the transistor performance.

Other steps may include activating the pixel pad and field shield to increase on-current for the thin film field effect transistor. The step of forming an insulating layer may include setting a thickness of the insulating layer in accordance with performance criteria for the thin film transistor. The step of patterning the conductive layer may include patterning the conductive layer such that the field shield of a first pixel cell extends over a thin film transistor of an adjacent cell or over a pixel pad of an adjacent cell.

A detailed description is given in the following embodiments with reference to the accompanying drawings.

BRIEF DESCRIPTION OF THE DRAWINGS

These and other aspects of the invention will be further explained with reference to the Figures, which are purely diagrammatical and not drawn to scale, and in which the same reference numbers refer to the same or equivalent parts, and in which.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The present disclosure provides an improved pixel circuit, which includes a field shield to enhance the performance of a thin film transistor associated with the pixel circuit. A field shielded backplane in accordance with embodiments of the present invention increases the optical performance of the display by adding an additional metal layer (e.g., a third metal layer) to a pixel stack. An additional function is further given to the field-shield layer, which includes improving the switching properties of the pixel TFTs by using the field-shield layer as a second gate of the TFTs. Embodiments herein enhance the on-current of the TFT, while retaining the high optical performance of the display.

Illustrative embodiments of the present invention will now be described in terms of organic TFT pixel circuits; however and TFT pixel circuit may benefit from the teachings of the present invention. In addition, the present invention may include any pixel circuits for devices such as liquid crystal displays, E ink displays or any other display or device.

Figure 1:
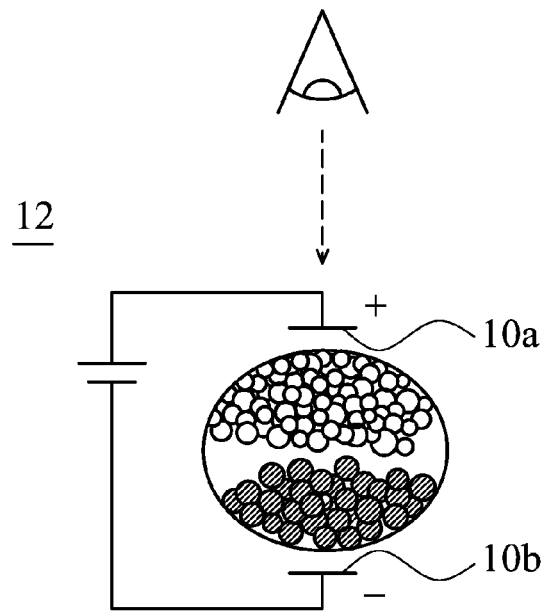
FIG. 1 is a schematic diagram showing an E ink display in accordance with the prior art.
Figure 2:
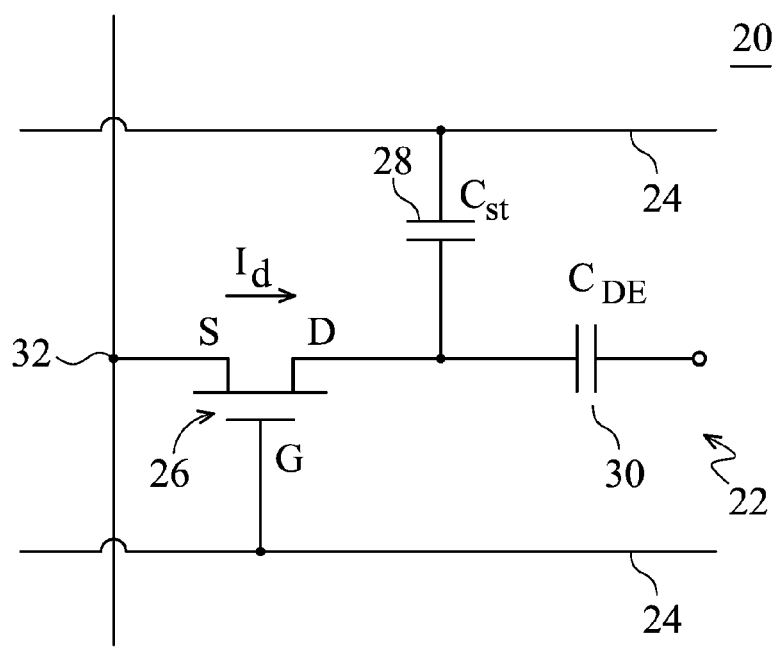
FIG. 2 is a schematic diagram showing an pixel cell for an active matrix display including E ink displays in accordance with the prior art.
Figure 3:
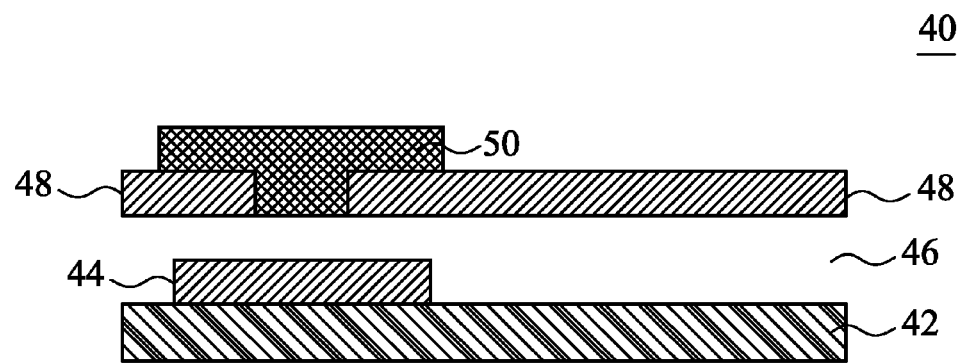
FIG. 3 is a cross-sectional view showing an illustrative stack for an active display pixel cell.

Referring now to the drawings in which like numerals represent the same or similar elements and initially to FIG. 3, a stack 40 may be used in organic TFTs pixel circuits. An active-matrix circuit as shown in FIG. 3 is processed on, for example, plastic foils 42 (substrate) resulting in an active-matrix (AM) backplane that can be integrated into a flexible display. Possible materials that can be used for the various layers are shown in Table 1. The preferred stack 40 starts with a highly conductive gate layer 44 (e.g. noble metal or indium-tin oxide), followed by an organic insulating layer 46, a second conductive layer 48 and an organic semiconducting layer 50. The organic layers 46 and 50 are preferably deposited by spin-coating. The layers can be patterned by photolithography, either by use of the intrinsic photosensitivity of the layers (e.g. the insulating layer) or by use of a photoresist (e.g. for most of the semiconductors and conductors). Layer 48 forms a column electrode 47 and a pixel pad 110, and layer 44 forms the row electrode 45.

Table 1 shows illustrative materials which may be used for an active-matrix circuit with polymer electronics.

| Layer | Material |
| --- | --- |
| Substrate* | Polycarbonate, Polyethylene naphtalene, ... |
| Gate line | Au, Al, Cu, Indium-tin oxide ... |
| Insulating layer | Photoresist: HPR504, SU8 ... |
| Data line/Pixel pad | Metal: Au, Pd, Pt, ZnSnO$_3$, SnO$_2$:F, Ag |
| Semiconductor | Poly-(thienylene vinylene), pentacene, ... |

*Base material that can be coated with a number of barrier laye

Stack 40 may be employed as a basis for providing features in accordance with the present invention. Stack 40 may be replaced with other pixel circuits and may still benefit from the teachings of the present invention.

Figure 4:
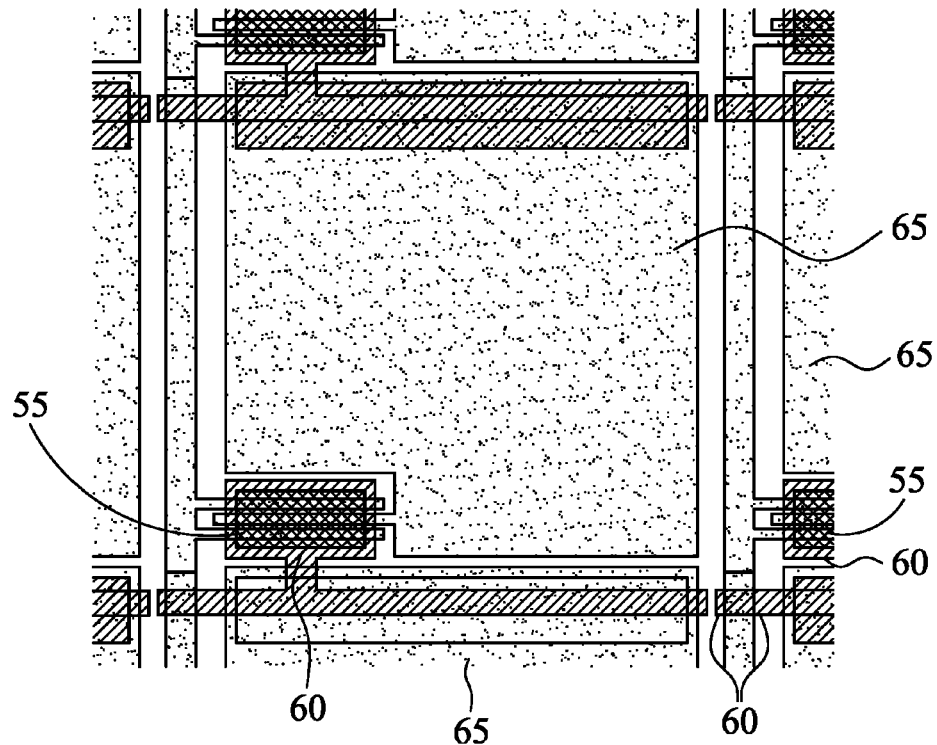
FIG. 4 is an elevation view of a pixel cell corresponding with the stack of FIG. 3.

Referring to FIG. 4, a current pixel cell layout of the active matrix backplane is illustratively shown. First areas 55 show the positions of semiconductor islands. Second areas 60 denote the $1^{st}$ metal layer: Third areas 65 show the $2^{nd}$ metal layer, while the continuous insulating layer is not shown. Pixel layout of the backplane design in FIG. 4 does not yet include a field shield.

Figure 5:
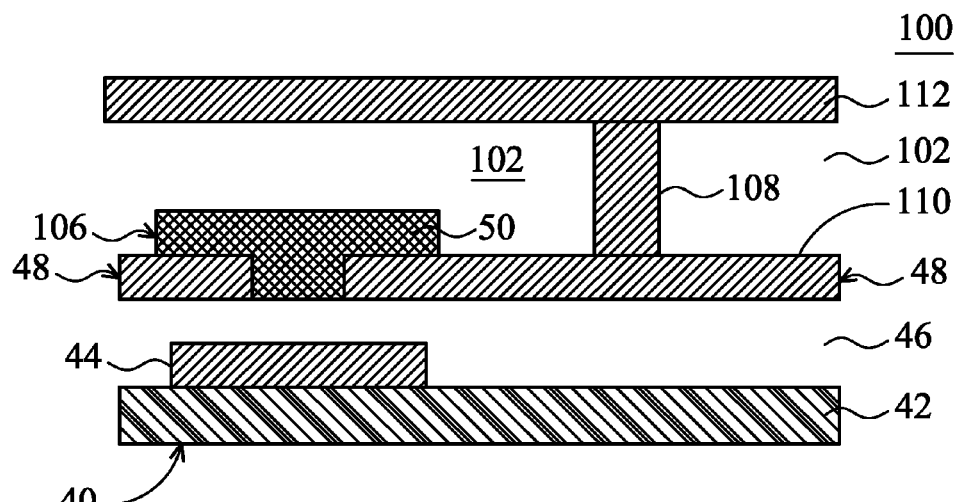
FIG. 5 is a cross-sectional view showing an insulating layer and field shield formed on the stack of FIG. 3 in accordance with one embodiment.

Referring to FIG. 5, a stack 100 includes a field-shielded stack for one pixel with an organic TFT to be employed for displays with organic electronics. In this embodiment, two layers are illustratively added to the stack 40 of FIG. 3. An insulating layer 102 and a conductive layer 104 are formed on stack 40. Some of the advantages of this stack 100 include higher contrast, lower optical crosstalk and a more uniform switching of the pixels due to the shielding of the electrical fields of the row and column electrodes by the field shield electrode.

Insulating layer 102 may include a photoresist material or other organic insulation material. Insulating layer 102 is formed over a semiconductor material 50 which forms a portion of a TFT 106. Semiconductor material 50 may include an inorganic or organic semiconductor material. In one embodiment, material 50 includes pentacene, although other materials may also be employed. After preparing insulating layer 102, conductive layer 104 is formed on insulating layer 102. Insulating layer 102 may be patterned to form openings to permit via connections 108 through insulating layer 102. Vias 108 may be formed concurrently with conductive layer (e.g., using a dual damascene technique) or formed separately from layer 104. Conductive layer 104 may include, e.g., Au, Al, Cu, Indium-tin oxide, Pd, Pt, ZnSnO$_3$, SnO$_2$:F, Ag or any other suitable conductor.

Conductive layer 104 connects to a pixel pad 110 formed from layer 48 (FIG. 3). Conductive layer 104 forms a field shield 112 over pixel pad 110, and further extends over at least a portion of the pixel pad 110 (or other pixel electrodes) and in a preferred embodiment over at least a portion of TFT 106. In this way, field shield 112 forms a capacitive relationship with TFT 106, which may be employed to improve TFT performance as will be explained herein below. The thin film field effect transistor 106 may include an organic interlayer dielectric layer 46 between conductive and/or semiconductive portions.

Figure 6:
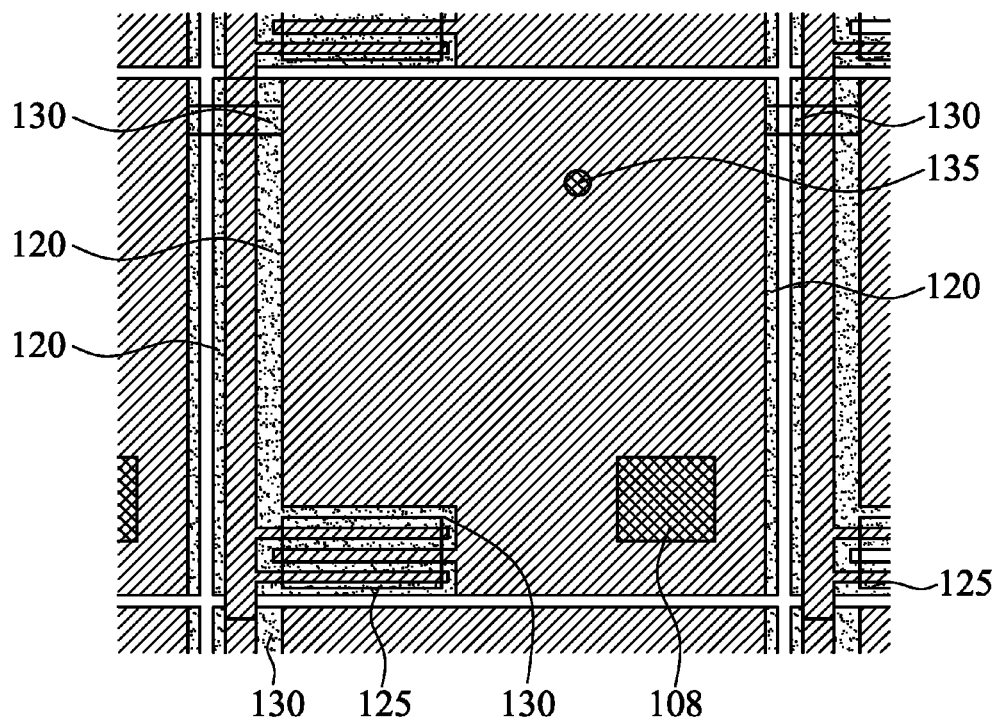
FIG. 6 is an elevation view of the pixel cell corresponding with the stack of FIG. 5.

Referring to FIG. 6, the field-shielded pixel circuit of the active matrix backplane is illustratively shown. A first area 120 shows the conductive layer 104 (the field shield). Second areas 125 show the positions of the semiconductor islands. Third areas 130 denote the 1.sup.st metal layer. Fourth areas 135 show the 2.sup.nd metal layer, while the continuous insulating layer is not shown.

An ideal pixel TFT delivers a high on-current, while it occupies a small area in the pixel. One problem includes that this ideal is never reached, especially not with organic electronics. The higher the on-current, the larger the display that can be made. The smaller the TFT area, the higher the yield of the active-matrix backplane.

Figure 7:
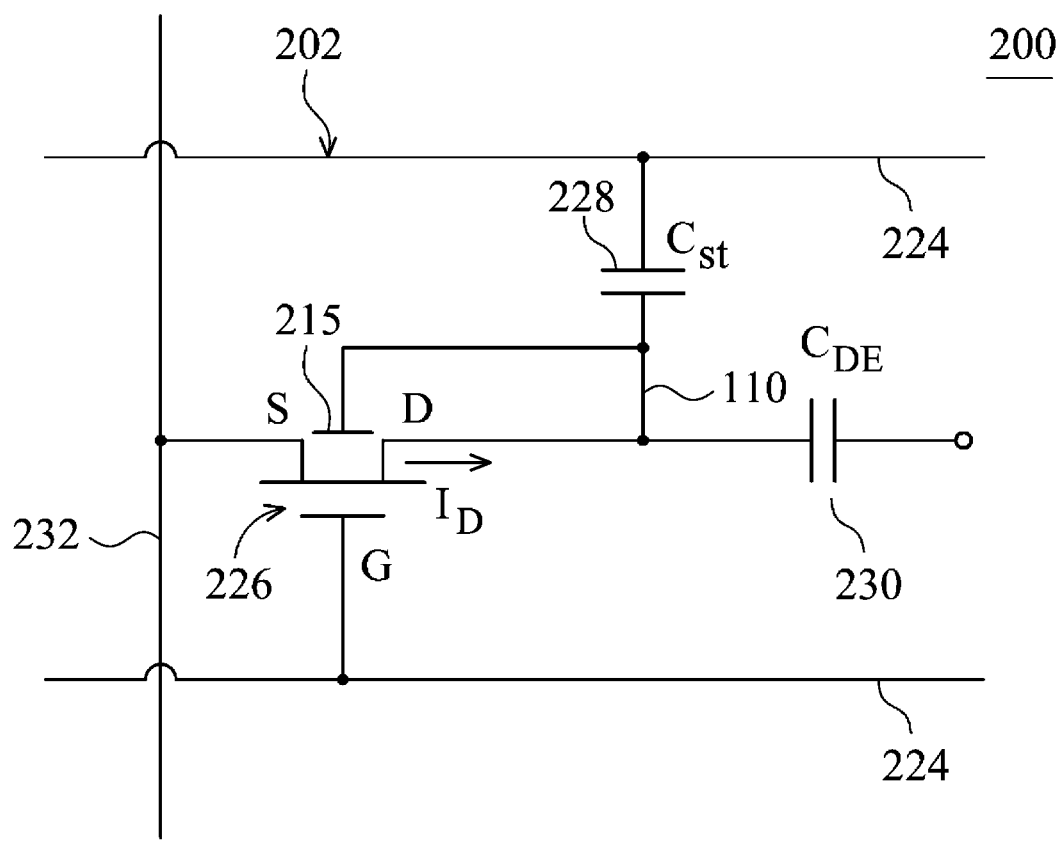
FIG. 7 is a schematic diagram showing the pixel cell for an active matrix display shown in FIGS. 6 and 7 showing a second gate.

In accordance with the present invention, conductive layer 104 provides a field-shield for a display which offers the opportunity to increase the on-current of the TFT 106, while its area is not increased, by using the layer 104 as a "second gate" of the TFT 106 (see FIG. 7). The transfer characteristics are illustratively shown in FIG. 8 for different values of the second gate formed in the layer 104.

Referring to FIG. 7, an equivalent active-matrix pixel circuit 200 for a field shielded pixel is illustratively shown in accordance with one embodiment. A single pixel 202 is shown, which may be part of a plurality of pixels forming an active-matrix display. A row electrode 224 forms a storage capacitor for the pixels in a next row. Active-matrix displays are driven a row-at-a-time. During one frame time, all the rows are sequentially selected by applying a voltage that changes thin film transistors (TFTs) 226 from a non-conducting state to a conducting state. In this line selection time, capacitors 228 and 230 and capacitance between the gate and drain of TFT 226 (i.e. the total capacitance at the drain side of the TFT) of the selected row are charged to the voltage supplied on a column electrode 232 (e.g., +/−15V, 0V).

During the remaining frame time (i.e. the hold time), the other rows are addressed. The TFTs 226 are then in their non-conducting state and the charge on the pixel capacitors 228 and 230 is retained. Between image updates the active-matrix is at rest at 0 V for the row and column electrodes, the pixel pads and the common electrode.

$C_{DE}$ is the capacitor 230 providing the display effect, $C_{st}$ is the storage capacitor 228, and $C_{gd}$ is the parasitic gate-drain capacitor in the TFT 226. In the circuit 200, the previous row electrode forms the storage capacitor line. The pixel pad 110 forms a second gate 215 of the TFT 226.

Figure 8A:
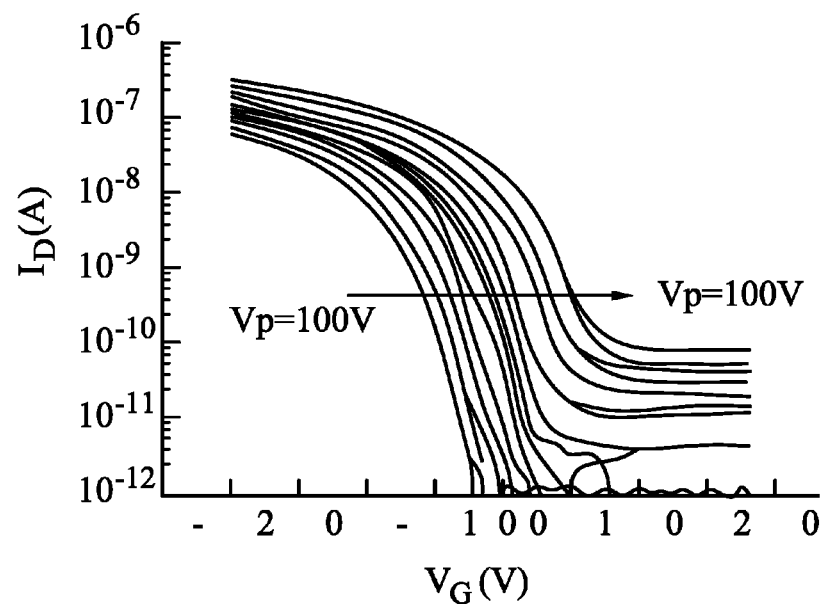
FIG. 8 is a plot of characteristic curves for a thin film transistor in the pixel cell of FIG. 7.
Figure 8B:
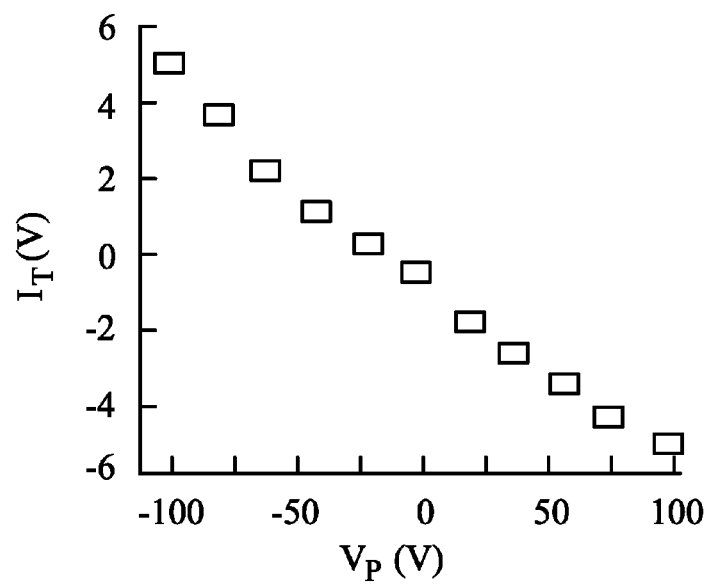

Referring to FIG. 8, transfer characteristics of a field shielded organic TFT with a mobility of 0.01 cm.sup.2/Vs for the pixel electrode (i.e. the 3.sup.rd metal layer 104) voltages ($V_P$) from +100V to −100V, in steps of 20V are illustratively shown. Drain current $I_D$ through the transistor is plotted against gate voltage ($V_G$). An inset plot 300 shows extracted threshold voltage ($V_T$) as a function of pixel electrode voltage ($V_P$), where the channel length of the TFT is 5 microns and width of 1000 microns, with supply voltage $V_D$=−1V.).

Without a field shield, the on-current of the TFT is lower when the pixel is charged to a negative voltage compared to charging to a positive voltage. This is due to the lower source-gate voltage when charging to a negative voltage. Pixel charging to a negative voltage is therefore one of the determining factors for the size of the pixel TFT.

With the field shielding, the on-current during charging to a negative voltage is increased due to the negative voltage on the second gate 215 (FIG. 7). The on-current during charging to a positive voltage will be lower. This results in more symmetric charging characteristics and the possibility for using a smaller pixel TFT.

A number of alternate embodiments may be employed using different configurations of second gate 215 in a display.

Figure 9:
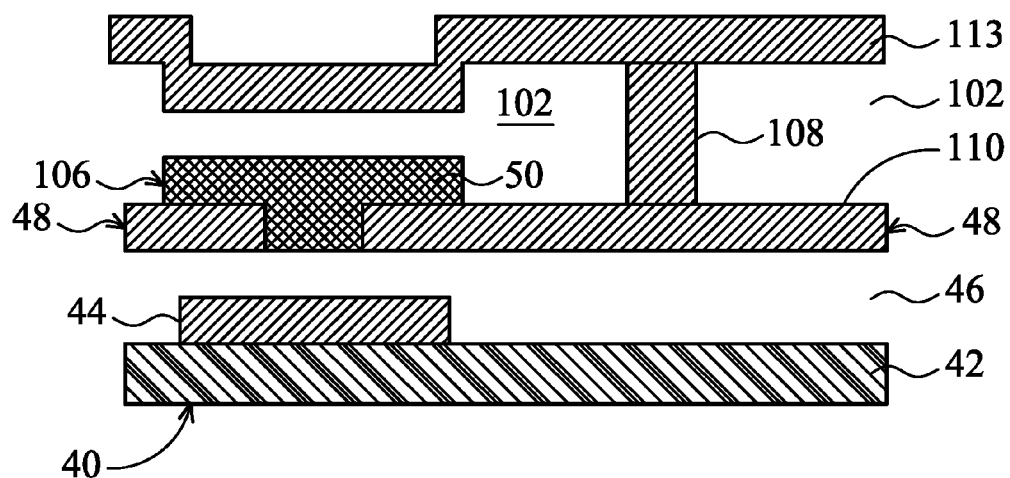
FIGS. 9 and 10 show two alternate embodiments for formation of an insulation layer and field shield.

Referring to FIG. 9, insulating layer 102 may be patterned or otherwise altered to provide different thicknesses over TFT 106 and other areas of the pixel cell. This adjusts the second gate 215 (FIG. 7) by selecting an appropriate insulating layer thickness between semiconductor 50 and a field shield 113. It is preferable that the field shield insulating layer 102 be as thick as possible to avoid electrical crosstalk between the field shield 113 and the row and column electrodes in layers 44 and 48, respectively. When the insulating layer 102 is thin on the other hand the conductive layer 104 can increase the on-current of the TFT because of its effect as a second gate.

Figure 10:
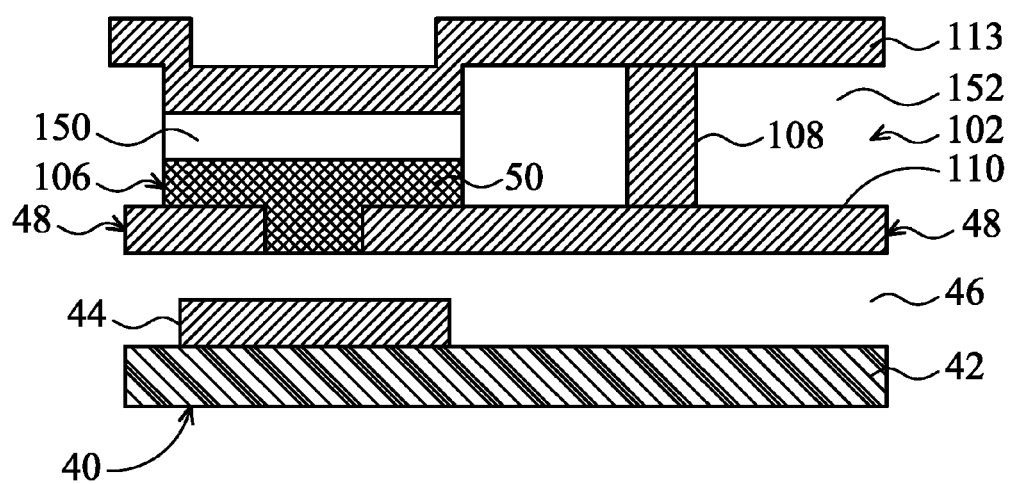

Referring to FIG. 10, two different insulating layers 150 and 152 may be employed for insulating layer 102. Layer 150 may be employed to provide the appropriate thickness of the dielectric between field shield 113 and semiconductor 50. Layer 152 may be formed and patterned on layer 150 providing a different thickness for the insulating layer in other areas. Layers 150 and 152 may include a same material or different materials. The layers 150 and 152 are patterned to form via holes or other structures. To avoid the compromise between a higher on-current and electrical crosstalk, a thin second insulating layer 150 in the region of the TFT 106 and a thick insulating layer 152 may be applied in the rest of the pixel. This maximizes the increase of the on-current, while the electrical crosstalk is minimized.

This stack can be made in a number of ways. One possibility is to omit stripping of the resist (layer 150) that is used for patterning the semiconductor 50, followed by patterning the second insulating layer 152 in the region of the TFT 106. The resist 150 may be about 1 micron thick, while the insulating layer 152 can be much thicker (e.g., 5 microns). Other thicknesses are also contemplated.

Figure 11:
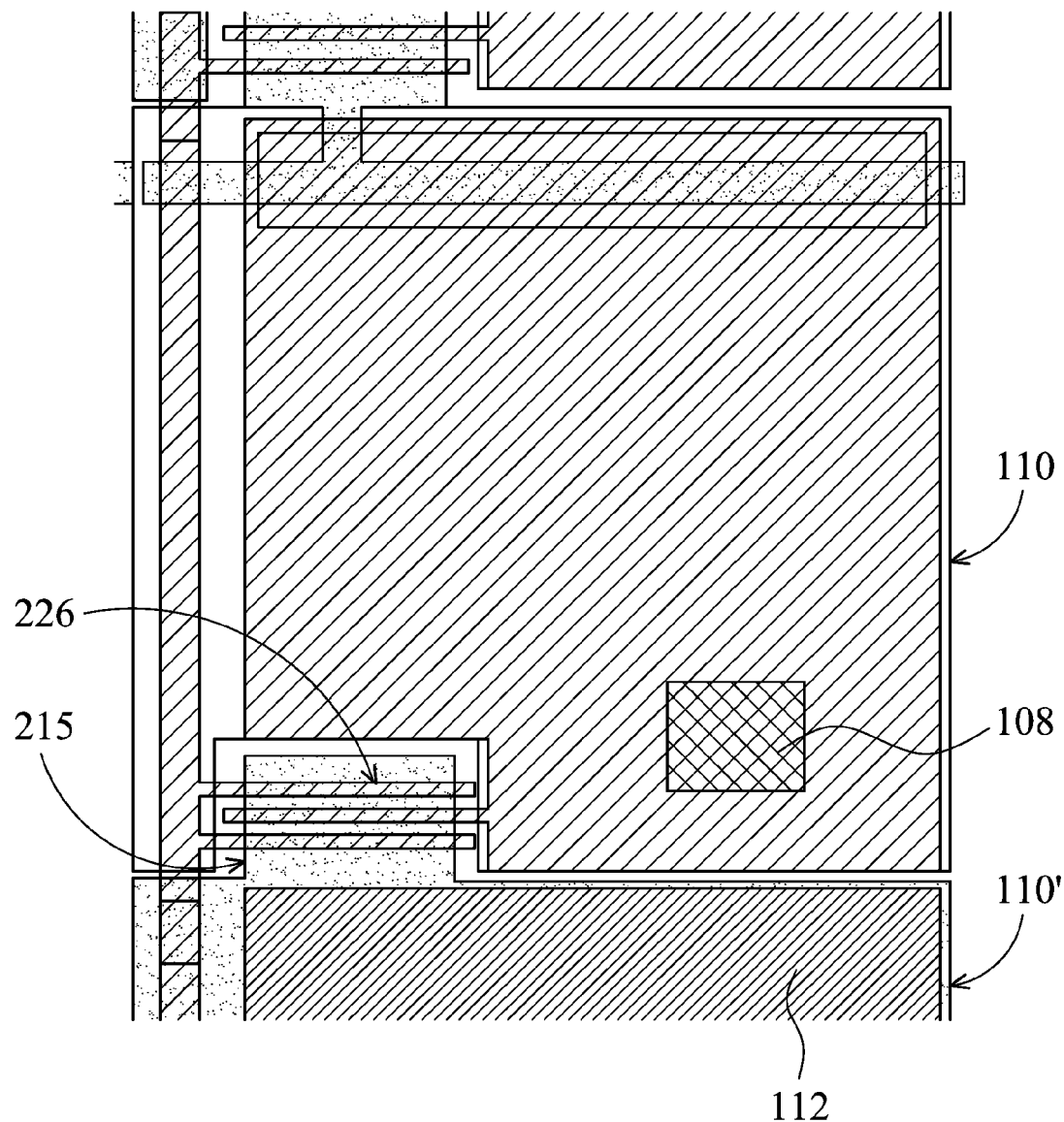
FIG. 11 is an elevation view of a pixel cell having the filed shield extending over a neighboring pixel cell's transistor in accordance with an alternate embodiment.

Referring to FIG. 11, a field-shielded stack for one pixel with an organic TFT is shown, where a second gate 215 is formed by an overlap of a field shield 112 between a TFT 226 and/or a pixel pad 110 in the next row. Using the second gate 215, a boost for the on-current is provided.

The second gate 215 is connected to the next pixel pad 110' in an adjacent pixel cell. An equivalent circuit is illustratively shown in FIG. 12.

Figure 12:
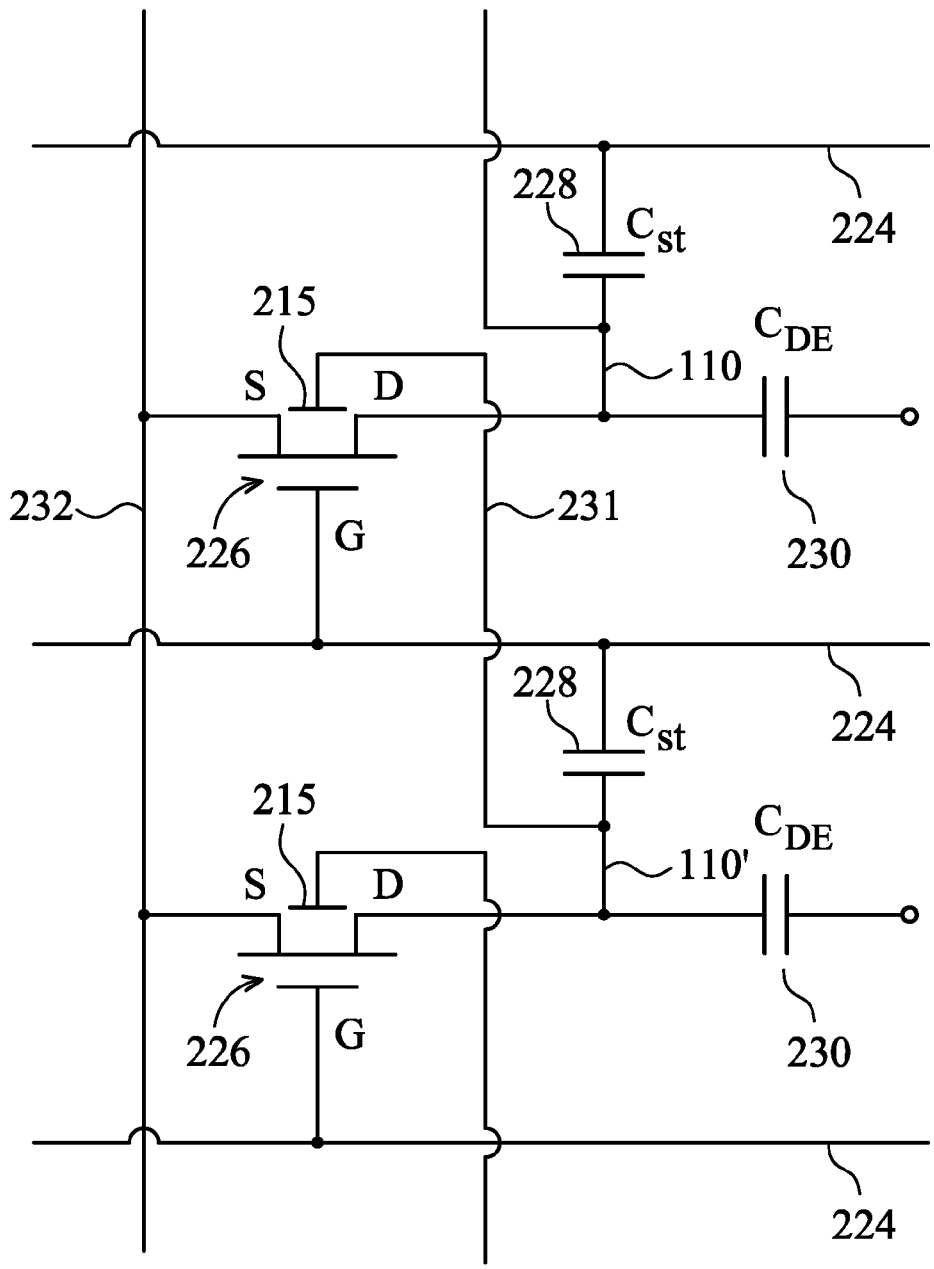
FIG. 12 is a schematic diagram showing the pixel cell for an active matrix display shown in FIG. 11.

Referring to FIG. 12, an active-matrix pixel schematic is shown for an embodiment for the field shielded pixel structure of FIG. 11. The pixel electrode 110' of an adjacent row is connected to the second gate 215 of the TFT 226 by a connection 231.

To illustrate some of the advantages of the structure shown in FIGS. 11 and 12, the following example is provided. The pixel pad 110 is driven between say, +15V and −15V. When the pixel is refreshed, the gate electrode (G) (e.g., the row line 224) is set from +25V to −25V. The gate electrode (G) is a storage capacitor of the next row of pixels. This next row of pixels is therefore set to a pixel voltage between −65V and −35V during the refresh period. By connecting the second gate 215 of the pixel to the pixel pad of the pixel in the next row, this large negative voltage is applied to the TFT 226 during the refresh. This leads to a factor of 3-5 times higher on-current during this time, as can be seen in FIG. 8. After the refresh period, the gate (G) is reset to +25V. The pixel pad 110 in the next row is then reset to the normal pixel voltage between +15V and −15V. This ensures that the leakage current in the pixel remains sufficiently low in the time between two refresh periods.

The field shield may extend over a portion of the thin film field effect transistor of an adjacent pixel cell to form a capacitive relationship with a thin film field effect transistor of the adjacent pixel cell to enhance performance of that transistor Likewise, the field shield may extend over a portion of the pixel pad of an adjacent pixel cell to form a capacitive relationship with a pixel pad of the adjacent pixel cell to enhance performance of that pixel pad.

The embodiments described herein may be combined with other embodiments, for example, the gap between the field shield and the TFT (e.g., second gate) may be adjusted as described when the second gate is connected to the pixel pad of a next row. Other combinations are also contemplated.

Advantages aspects of the present invention include the TFT area can be made smaller while keeping the optical display performance optimal. This increases the yield of the displays and enables larger displays to be made with the current performance of the organic TFTs. Application areas include all active-matrix displays. These displays may include a field shielded design. The present invention can also be applied to other technologies other than organic electronics, for example, amorphous silicon or poly-crystalline silicon may also be employed.

While the invention has been described by way of examples and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a pixel for active matrix displays, comprising the steps of:
    forming an insulating layer on a pixel stack, the pixel stack including a thin film transistor, a pixel pad and addressing lines; and forming a conductive layer on the insulating layer to form a field shield connecting to the pixel pad by passing through the insulating layer and covering at least a portion of the thin film transistor to form a second gate of the film transistor, wherein the insulating layer has a different thickness between the field shield and the thin film transistor than between the field shield and other areas of the pixel.

2. The method as claimed in claim 1, further comprising the step of activating the pixel pad and field shield to increase on-current for the thin film transistor.

3. The method as claimed in claim 1, wherein the step of forming the insulating layer includes patterning the insulating layer to form an opening passing through the insulating layer.

4. The method as claimed in claim 3, further comprising the step of forming a via connection in the opening, wherein the via connection is formed concurrently with the conductive layer or formed separately from the conductive layer.

5. The method as claimed in claim 1, wherein the step of forming the insulating layer includes setting the thickness of the insulating layer in accordance with performance criteria for the thin film transistor.

6. The method as claimed in claim 1, wherein the thickness of the insulating layer between the field shield and the thin film transistor is smaller than the thickness of the insulating layer between the field shield and other areas of the pixel.

7. The method as claimed in claim 1, wherein the step of patterning the conductive layer includes patterning the conductive layer such that the field shield of a first pixel extends over a thin film transistor of an adjacent pixel.

8. The method as claimed in claim 1, wherein the step of patterning the conductive layer includes patterning the conductive layer such that the field shield of a first pixel extends over a pixel pad of an adjacent pixel.

9. The method as claimed in claim 1, wherein the step of forming the insulating layer includes forming a first insulating layer on the thin film transistor and forming a second insulating layer on the other areas of the pixel.

10. A method for forming a pixel for active matrix displays, comprising the steps of:

forming an insulating layer over a pixel stack, the pixel stack including a thin film transistor, a pixel pad and addressing lines; and patterning a conductive layer formed over the insulating layer to form a field shield which connects to the pixel pad, the field shield connecting to the pixel pad by passing through the insulating layer such that the field shield extends over at least a portion of an electrode of the pixel or at least a portion of the thin film transistor, wherein the step of patterning the conductive layer includes patterning the conductive layer such that the field shield extends over a portion of a pixel pad of an adjacent pixel to form a capacitive relationship with the pixel pad of the adjacent pixel.

11. The method as claimed in claim 10, further comprising the step of activating the pixel pad and field shield to increase on-current for the thin film transistor.

12. The method as claimed in claim 10, wherein the step of forming the insulating layer includes patterning the insulating layer to form an opening passing through the insulating layer.

13. The method as claimed in claim 12, further comprising the step of forming a via connection in the opening, wherein the via connection is formed concurrently with the conductive layer or formed separately from the conductive layer.

14. The method as claimed in claim 10, wherein the step of forming the insulating layer includes setting a thickness of the insulating layer in accordance with performance criteria for the thin film transistor.

15. The method as claimed in claim 10, wherein the step of patterning the conductive layer includes patterning the conductive layer such that the field shield extends over a portion of the thin film transistor to form a capacitive relationship with the thin film transistor to enhance performance of the thin film transistor.

16. The method as claimed in claim 10, wherein the step of patterning the conductive layer includes patterning the conductive layer such that the field shield extends over a portion of a thin film transistor of an adjacent pixel to form a capacitive relationship with the thin film transistor of the adjacent pixel to enhance performance of the thin film transistor of the adjacent pixel.

17. The method as claimed in claim 10, wherein the step of forming the insulating layer includes forming a first insulating layer on the thin film transistor and forming a second insulating layer on the other areas of the pixel.

18. The method as claimed in claim 17, wherein the first insulating layer has a thickness different from a thickness of the second insulating layer.

19. The method as claimed in claim 18, wherein the thickness of the first insulating layer is smaller than the thickness of the second insulating layer.

* * * * *